United States Patent [19]

Nakane et al.

[11] Patent Number: 4,474,642

[45] Date of Patent: Oct. 2, 1984

[54] METHOD FOR PATTERN-WISE ETCHING OF A METALLIC COATING FILM

[75] Inventors: Hisashi Nakane, Kawasaki; Muneo Nakayama, Tokyo; Akira Hashimoto, Yokohama; Toshihiro Nishimura, Kawasaki, all of Japan

[73] Assignee: Tokyo Denshi Kagaku Co., Ltd., Kawasaki, Japan

[21] Appl. No.: 514,793

[22] Filed: Jul. 18, 1983

[30] Foreign Application Priority Data

Jul. 20, 1982 [JP] Japan ................................ 57-125078

[51] Int. Cl.³ .......................... C23F 1/02; B44C 1/22; C03C 15/00; C03C 25/06
[52] U.S. Cl. .................................... 156/643; 156/646; 156/653; 156/656; 156/657; 156/659.1; 156/661.1; 204/192 E; 252/79.1; 430/317; 430/318
[58] Field of Search .......................... 204/192 E, 164; 252/79.1; 156/643, 646, 651–653, 656, 657, 659.1, 661.1, 665; 430/317, 318

[56] References Cited

U.S. PATENT DOCUMENTS 4,184,909 1/1980 Chang et al. .................. 156/643
4,352,724 10/1982 Sugishima et al. ............. 204/192 E Primary Examiner—William A. Powell
Attorney, Agent, or Firm—Armstrong, Nikaido, Marmelstein & Kubovcik

[57] ABSTRACT

The invention provides an improved process for providing wirings and electrodes of aluminum film on the surface of a substrate. Instead of the conventional method of directly forming an organic resist layer on the metal film, a remarkable improvement in the fineness and accuracy of patterning is obtained by providing a subsidiary masking layer, mainly composed of silicon dioxide, between the metal film and the organic resist layer; and pattern-wise etching by first etching the subsidiary masking layer through a patterned mask of the organic resist layer with a fluorine-containing etching gas to form a patterned subsidiary masking layer, and then etching the metal film with a chlorine-containing etching gas through the mask of the patterned subsidiary masking layer, followed by final removal of the remaining subsidiary masking layer.

12 Claims, 9 Drawing Figures

METHOD FOR PATTERN-WISE ETCHING OF A METALLIC COATING FILM

BACKGROUND OF THE INVENTION

The present invention relates to a method for the preparation of a semiconductor device by untrafine working. In particular, the present invention is directed to a method characterized by the ultrafine working of a semiconductor device, by pattern-wise etching of a metal layer to form a patterned layer or wiring of the metal on the substrate surface.

Wiring and electrodes or semiconductor devices are usually formed by aluminum, which is highly electroconductive metal suitable therefor. The pattern-wise layer of a metal on the substrate surface for the wiring and the like is conventionally formed by a method, comprising the steps of (1) vacuum depositing or sputtering a metal layer on the substrate surface having an electrically insulating film thereon, (2) forming a pattern-wise layer of a resist material on the metal layer, which is susceptible to light or actinic rays, such as electron beams, (3) etching of the unprotected surface of the metal with an etching solution containing, for example, phosphoric acid of an amine in the so-called wet process, and finally, (4) removing the film of the resist, thereby leaving the pattern-wise layer of the metal, e.g. aluminum, for the wiring and the like.

In recent years, the technology of electronics has been under rapid growth toward higher degrees of integration and increased performance of the semiconductor devices. This is represented by the transition from LSIs to ultra-LSIs. Thus, the requirements for finer working of semiconductor devices are escalating. A fineness of about 3 micrometers can be achieved by the conventional wet process of etching an aluminum surface for the preparation of a miniaturized semiconductor device. A further fineness of 2.5 to 2 micrometers or in the so-called submicron range of 1 micrometer or finer, can be achieved only by using the so-called dry etching method in place of the conventional wet process, from the standpoints of the dimensional accuracy and uniformity of etching, increasing requirements for an improved cross-sectional forms of the etched pattern, and higher yield of the products.

While dry etching of an aluminum film can be performed in principle by use of a chlorine-containing gas, practical and feasible methods for the dry etching of aluminum film include the so-called reactive ion etching (RIE) method and plasma etching methods, the latter of which uses a pair of parallel plate electrodes. These methods are capable of exhibiting a mechanical force on the aluminum surface, which is readily covered with a surface film of aluminum oxide and barely susceptible to etching by the chemical means alone. When the above mentioned RIE method or plasma etching is used on an aluminum film, the temperature of the surface is remarkably increased, due to the energetic conditions of etching or bombardment of the surface with strongly accelerated ions. As a consequence, thermal deformation is sometimes unavoidable when the resist masking is made of a conventional organic resist material, which are susceptible to actinic rays such as ultraviolet light, electron beams, X-rays. This results in a decreased resolving power of the etched pattern by decreasing the distance between the patterned lines. Alternatively, an unusually large decrease in the film thickness of the resist layer may result. Thus, no satisfactory organic material is available suitable for use as a resist masking, which is capable of withstanding the severe conditions encountered in the dry etching of an aluminum film on the substrate surface.

A procedure for compensating for the decrease in the thickness of the resist film may be to increase the thickness of the resist film, thereby taking into account the decrease in thickness during processing. However, this method is not always applicable, because it results in a decrease of accuracy or resolving power when patterning the resist layer, due to the increased thickness thereof.

SUMMARY OF THE INVENTION

Thus, an object of the present invention is to provide a method for forming an extremely fine pattern of a film of aluminum or other metals on a substrate surface, by pattern-wise dry etching, which can be used as a process for making a semiconductor device having a fineness of ultra-LSIs.

Another object of the invention is to provide a method for forming an extremely fine pattern of a film of aluminum or the like metal on a substrate surface, without the need of any specific or troublesome procedures required by the prior art methods.

The method of the present invention for forming an extremely fine pattern of a surface film of aluminum or the like metal on a substrate surface of semiconductor, by a method of pattern-wise dry etching, comprises the steps of:

(a) forming a film of a metal on the substrate;

(b) forming a subsidiary masking layer mainly composed of silicon dioxide on the said film of the metal;

(c) forming a layer of an organic resist material sensitive to actinic rays on the said subsidiary masking layer;

(d) patterning of the layer of the organic resist material;

(e) pattern-wise etching of the subsidiary masking layer through the patterned layer of the organic resist material as the mask;

(f) pattern-wise dry etching of the film of the metal through the subsidiary masking layer etched pattern-wise in the step (e) with a chlorine-containing etching gas; and (g) removing the subsidiary masking layer.

It is preferable that the pattern-wise etching of the subsidiary masking layer in the above step (e) is performed in a dry process by use of a fluorine-containing etching gas and that the removal of the remaining subsidiary masking layer in the step (g) is performed by a dry etching method with a fluorine-containing gas.

DETAILED DESCRIPTION OF THE PREFERRED EMBODIMENTS

The above-described method of the present invention has been completed as a result of extensive investigations undertaken by the inventors to develop a novel and improved process for forming an extremely fine pattern of a film of aluminum or the like metal by the RIE method, or by the plasma etching method with use of a pair of parallel plate electrodes, which can be used in the manufacture of semiconductor devices having a fineness of ultra-LSIs. The present invention is based on the discovery that, while no satisfactory pattern-wise etching can be performed by using a masking of an organic resist material alone; pattern-wise etching of a film of aluminum or the like metal with the highest degree of fineness can be achieved when a thin layer of an inorganic material, such as silicon dioxide, which is resistant to dry etching with a chlorine-based etching gas but susceptible to dry etching with a fluorine-based etching gas, is formed on the film of aluminum or the like metal and used as a subsidiary masking layer for the organic resist.

In the following description, the method of the present invention is illustrated with reference to the accompanying drawing in which aluminum is used as the metal for the surface film on the substrate.

Figure 1A:
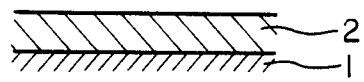
FIGS. 1a to 1i each illustrate a step of the present invention, as viewed by the cross section of a substrate and layers thereon.

In the first step of the method as illustrated in FIG. 1a, the substrate plate 1 is provided on one surface thereof with a film of aluminum 2 by a suitable technique, such as vacuum deposition or sputtering.

Figure 1B:
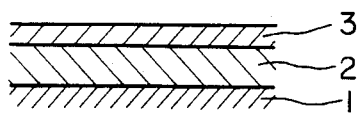

Next a thin layer 3 of silicon dioxide ($SiO_2$) is coated on the aluminum film 2, as is illustrated in FIG. 1b. This layer of silicon dioxide can be formed by a known method, such as the vapor phase deposition, e.g. so-called PVD method and CVD method. Alternatively, thin layer 3 can be formed by the method of spin-on coating and baking. This silicon dioxide film 3 serves as a subsidiary masking in a step of patterning of the aluminum film 2 by etching, which is described below. The thickness of this silicon dioxide film 3 is preferably in the range from 50 to 500 nm.

When the substrate plate 1 is also made of silicon dioxide, care should be taken to minimize the damage to the substrate plate 1 in the subsequent step of removing the residual subsidiary masking layer 3a by etching, since the substrate plate may be simultaneously subjected to etching along with the subsidiary masking layer 3a. In this regard, it is advantageous that the thickness of the silicon dioxide film 3 is as small as possible or that the silicon dioxide material of the subsidiary masking layer 3 has a higher susceptibility to etching than the substrate plate 1 to removal by the etching. A subsidiary masking layer having such a high susceptibility to etching is preferably obtained by the spin-on coating method. In particular, a phosphosilicate glass (PSG) is suitable for the subsidiary masking layer and can be formed by a spin-on coating solution containing phosphorus pentoxide ($P_2O_5$). Further, it is advantageous from the practical standpoint that the subsequent baking treatment in this case is not performed to an excessive extent.

Figure 1C:
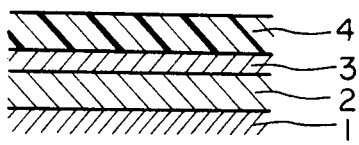
Figure 1D:
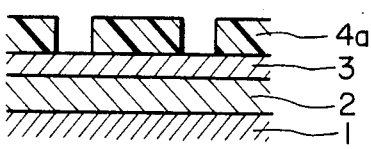

After formation of the subsidiary masking layer 3 of silicon dioxide on the aluminum film 2, the subsidiary masking layer 3 is coated with a photosensitive composition, thereby forming a photoresist layer 4, as is illustrated in FIG. 1c. The photoresist layer 4 is then patterned into a finely patterned masking layer 4a according to the desired pattern, as is illustrated in FIG. 1d. The procedure of the patterning step is rather conventional and the photoresist layer 4 in FIG. 1c, which is sensitive to actinic rays, such as ultraviolet light, far ultraviolet light, electron beams, X-rays and the like, is processed by the microphoto lithography procedures. This includes pattern-wise exposure of the resist layer to actinic rays, i.e. ultraviolet light, far ultraviolet light, electron beams or X-rays, followed by development. It is essential that the organic resist material 4 and the procedure for the processing thereof should be selected and performed, by taking into consideration the desired performance of the masking layer 3.

Figure 1E:
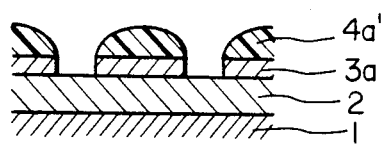

After the above-described step of patterning the organic resist layer to form the patterned masking layer 4a, the subsidiary masking layer 3 of silicon dioxide is dry etched through the open areas of the organic masking layer 4a to form the patterned subsidiary masking layer 3a, as illustrated in FIG. 1e. This dry etching of the subsidiary masking layer 3 is satisfactorily performed by using a fluorine-containing etching gas, such as trifluoromethane, tetrafluoromethane, hexafluoroethane and octafluoropropane, as well as a gaseous mixture of tetrafluoromethane and oxygen or hydrogen. The shoulder portions of the patterned masking layer of the organic resist material 4a are usually rounded by this treatment of dry etching so as to provide a pattern-wise masking layer 4a' with rounded shoulders as shown in FIG. 1e. The dry etching of the subsidiary masking layer 3 of silicon dioxide is performed, of course, to such an extent that the surface of the aluminum layer 2 is exposed in the areas not protected by the pattern-wise organic masking layer 4a'. (This, of course, would be layer 4a, if the rounded shoulders of pattern-wise masking layer 4a' are not present.) This provides a patterned subsidiary masking layer 3a, as shown in FIG. 1e.

Figure 1F:
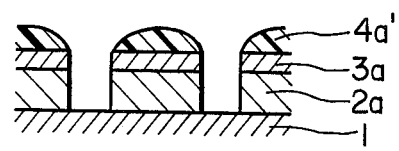

After the above-described pattern-wise etching of the subsidiary masking layer 3 with a fluorine-containing etching gas, pattern-wise dry etching of the aluminum layer 2 is carried out, through the patterned subsidiary masking layer 3a to form the desired pattern 2a of the aluminum layer, as shown in FIG. 1f. This pattern-wise dry etching can be performed by using a chlorine-containing gas in an apparatus for the RIE process or in an apparatus for plasma etching equipped with a pair of parallel plate electrodes. In this case, the patterned masking layer 4a' of the organic resist material is also subjected to the ion bombardment into the patterned layer 4a' which decreases the thickness thereof. A suitable chlorine-containing gas for this step can be selected from carbon tetrachloride, boron trichloride and silicon tetrachloride, but it is not limited thereto.

Figure 1G:
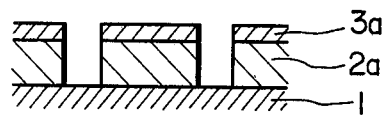

Thereafter, the masking layers are removed, because the masking layers are no longer useful. First, the patterned masking layer 4a' of the organic resist material is removed. The method for removal of masking layer 4a' is not particularly limitative, but a preferable method is the oxidative plasma etching in a plasma atmosphere of oxygen gas. However, a conventional wet process by use of a remover agent is equally applicable. As a result of the removal of the organic resist layer 4a', the surface of layer 3a is exposed as shown in FIG. 1g.

Figure 1H:
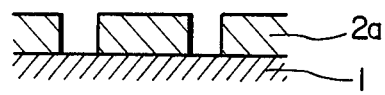

Finally, the patterned subsidiary masking layer of silicon dioxide is removed, thereby exposing the surface of the finely patterned layer of aluminum 2a, as is shown in FIG. 1h. A preferable method for the removing of the residual subsidiary masking layer 3a of silicon dioxide is dry etching with a fluorine-containing etching gas. This can be performed in about the same manner as in the step for the pattern-wise dry etching of the initially formed subsidiary masking layer 3 to give the pattern 3a. Alternatively, a conventional wet process can be used by using an etching solution containing hydrofluoric acid.

Figure 1I:
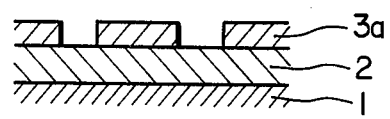

Although the above-described sequence of the steps is the most typical embodiment of the present invention, several modifications in the sequential order of the steps can be made thereto. For example, the pattern-wise dry etching of the aluminum layer 2 with a chlorine-containing gas may be preceded by the removal of the masking layer 4a' of the organic resist material, as shown in FIG. 1i.

As understood from the above description, a most characteristic or important feature of the present invention is the use of the subsidiary masking layer, the main component of which is silicon dioxide. This silicon dioxide-based subsidiary masking layer can be formed with any coating composition capable of being converted into a siliceous coating layer by baking, after application thereof on the surface of the aluminum layer by a suitable coating method. It is preferable to apply this layer by a coating method, because this method has better workability when compared to other methods. Also, a silicon dioxide layer can be applied by the vapor deposition method, even though such a method is undesirable due to its inapplicability to a mass production system, in addition to the necessity of a large scale equipment. Examples of the liquid coating composition suitable for the formation of the silicon dioxide-based subsidiary masking layer include a solution of a hydroxysilane obtained by the hydrolysis of a halogenosilane, or an alkoxy silane in an organic solvent or a solution of phosphosilicate glass containing a phosphorous compound.

The organic resist material which is sensitive to actinic rays and used in the present invention, may be any one of the commercially available materials. Irrespective of the type organic resist material used, they can inherently withstand the conditions of etching undertaken in the present invention.

Furthermore, the pattern-wise etching of the subsidiary masking layer of silicon dioxide is not particularly limited and may include dry and wet etching processes, even though the above description is for dry etching procedures.

In summary, the method of the present invention has been achieved by utilizing the following five points of technical merit, whereby an extremely fine and accurate working of wirings and electrodes on a substrate surface, mainly composed of aluminum can be achieved:

(1) The metallic film is readily etched with a chlorine-containing gas but hardly etched with a fluorine-containing gas; and a film of PSG or a glassy material, mainly composed of silicon dioxide, is hardly etched with a chlorine-containing gas but readily etched with a fluorine-containing gas;

(2) When the dry etching of the metallic film is performed by the RIE process, or by the method of plasma etching with a pair of parallel plate electrodes, the accuracy of etching is hardly affected, even when the thickness of the resist layer is increased to some extent. This is because these etching methods are suitable for the so-called anisotropic etching with directionality and are capable of providing an etched pattern exactly in conformity with the pattern of the resist, which may have a multi-layer structure;

(3) While it is conventionally considered indispensable that the metallic surface should be pre-treated with a silane coupling agent in view of the poor adhesion of a resist material to the metallic surface; in the present invention, the subsidiary masking layer of PSG or a glassy material mainly composed of silicon dioxide, formed on the metallic surface, has an improved adhesion with the resist material thereon; so that such a pre-treatment with a silane coupling agent can be omitted;

(4) While it is known that dry etching of a metallic film with a chlorine-containing gas is undesirable due to the adverse effect on the usable life of the metal wiring and the like and that the semiconductor silicon so etched has the chlorine ions adsorbed and retained on the substrate surface; dry etching with a fluorine-containing etching gas, followed by etching with a chlorine-containing gas, results in a substitutive adsorption by the fluorine-containing gas for the chlorine-containing gas, so that the adverse effects by the chlorine ions can be mitigated; and (5) While the present invention requires the formation of the subsidiary masking layer of PSG or a glassy material mainly composed of silicon dioxide on the surface of the metallic film, which is performed by the CVD method or the spin-on method; the film of PSG or a glassy material mainly composed of silicon dioxide is susceptible to dry etching with a fluorine-containing gas. In particular, a film of PSG composed of silicon dioxide containing phosphorus pentoxide $P_2O_5$ is quite satisfactory from the view points of baking and gettering, as well as removability by etching.

In the above description, the method of the present invention is illustrated for the embodiments in which a film of PSG or a glassy material mainly composed of silicon dioxide is used as the subsidiary masking layer; and the layer of aluminum thereunder is subjected to the dry etching with a chlorine-containing gas, following the dry etching of the subsidiary masking layer with a fluorine-containing etching gas. However, it should be understood that the scope of the present invention can be broadened to include other combinations of the materials of the subsidiary masking layer and the etching gases, and other kinds of metallic films such as tungsten, titanium, molybdenum, niobium, tantalum and the like, as a matter of course.

Following exmaples illustrate, but in no way limit, the method of the present invention.

EXAMPLE 1

An aluminum film of about 1 $\mu$m thickness was formed on a substrate plate of semiconductor silicon by vacuum deposition. An organic coating solution of alkoxysilanols for providing the silicon dioxide-based coating film, as supplied by Tokyo Ohka Kogyo Co., Japan (OCD, a product name by the company), was applied to the aluminum-coated substrate by spincoating, and this was followed by baking at 450° C. for 30 minutes, thereby forming a film of silicon dioxide having a thickness of about 100 nm.

Thereafter, a patterned resist layer was formed on the silicon dioxide layer in a conventional manner by use of a commercially available resist material sensitive to far ultraviolet light (ODUR-1010, a product name by Tokyo Ohka, supra), and this was followed by pattern-wise plasma etching of the silicon dioxide film to give a patterned subsidiary masking layer of silicon dioxide by undertaking plasma etching for 1 minute with supply of a radio frequency electric power of 200 watts to the electrodes of a plasma chamber with parallel plate electrodes. The pressure of the atmosphere inside the plasma chamber was kept at 0.2 Torr, by introducing 100 ml/min of hexafluoroethane gas.

Further, the aluminum film on the substrate surface was subjected to plasma etching for 4 minutes in the same plasma chamber with a power supply of 200 watts and under a pressure of 0.1 Torr by introducing 15 ml/min of carbon tetrachloride gas, and this was followed by the removal of the organic resist layer and the subsidiary masking layer thereunder. Removal of the organic resist layer was performed by oxidative plasma etching for 2 minutes in the same plasma chamber with a power supply of 300 watts and under a pressure of 1.5 Torr, by introducing 300 ml/min of oxygen gas. Then, the silicon dioxide film of the subsidiary masking layer was removed by plasma etching for 1 minute in the same plasma chamber with a power supply of 200 watts and under a pressure of 0.3 Torr, by introducing 50 ml/min of hexafluoroethane gas. The accuracy and fineness of the patterned wiring of aluminum on the substrate surface were quite satisfactory, as desired.

EXAMPLE 2.

An aluminum film, subsidiary masking layer and organic resist layer were successively formed on the surface of a semiconductor silicon substrate plate in substantially the same manner as in the preceding example, except that the coating solution OCD (a product name, supra) was admixed with phosphorus pentoxide, as a further additive, so as to form a subsidiary masking layer composed of PSG. After patterning of the organic resist layer in a conventional manner, pattern-wise etching of the PSG film was performed by the method of plasma etching in a plasma chamber having parallel plate electrodes with a radio frequency power supply of 300 watts for 1 minute under a pressure of 0.1 Torr, by introducing 20 ml/min of trifluoromethane gas, thereby providing a patterned subsidiary masking layer. Thereafter, the pattern-wise etching of the aluminum layer was performed in the same plasma chamber with a power supply of 250 watts for 4 minutes and under a pressure of 0.3 Torr, by introducing 15 ml/min of carbon tetrachloride gas and 100 ml/min of helium gas. This was followed by the removal of the organic resist layer by oxidative plasma etching for 2 minutes in the same plasma chamber with a power supply of 300 watts and under a pressure of 1.5 Torr, by introducing oxygen gas. The remaining patterned PSG film was removed by a wet process, using an aqueous solution containing hydrogen fluoride and ammonium fluoride, thereby providing a patterned wiring of the aluminum film with fineness and accuracy, as satisfactory as desired.

What is claimed is:

1. A method for pattern-wise etching of a metal film on the surface of a substrate which comprises the steps of:
   (a) forming a film of a metal on the substrate;
   (b) forming a subsidiary masking layer mainly composed of silicon dioxide on the film of the metal;
   (c) forming a layer of an organic resist material sensitive to actinic rays on the subsidiary masking layer;
   (d) patterning of the layer of the organic resist material, thereby forming a patterned organic resist layer;
   (e) pattern-wise etching of the subsidiary masking layer through the patterned organic resist layer as the mask, thereby forming a patterned subsidiary masking layer;
   (f) pattern-wise etching of the film of the metal through the patterned subsidiary masking layer as the mask with a chlorine-containing etching gas, thereby forming a patterned layer of the metal; and
   (g) removing the patterned subsidiary masking layer from the surface of the patterned layer of the metal.

2. The method as claimed in claim 1, wherein the pattern-wise etching of the subsidiary masking layer in the step (e) is performed by a dry process with a fluorine-containing etching gas.

3. The method as claimed in claim 1, wherein the removal of the patterned subsidiary masking layer in the step (g) is performed by a process of dry etching with a fluorine-containing etching gas.

4. The method as claimed in claim 1, wherein the subsidiary masking layer comprises a phosphosilicate glass.

5. The method as claimed in claim 2, wherein the fluorine-containing etching gas is selected from the group consisting of trifluoromethane, carbon tetrafluoride, hexafluoroethane, octafluoropropane, a mixture of carbon tetrafluoride and oxygen, and a mixture of carbon tetrafluoride and hydrogen.

6. The method as claimed in claim 1, wherein the pattern-wise etching of the film of the metal in the step (f) is performed in a plasma atmosphere of the chlorine-containing etching gas.

7. The method as claimed in claim 6, wherein the chlorine-containing etching gas is selected from the group consisting of carbon tetrachloride, boron trichloride and silicon tetrachloride.

8. The method as claimed in claim 1, wherein the removal of the patterned subsidiary masking layer in the step (g) is preceded by removal of the patterned organic resist layer.

9. The method as claimed in claim 8, wherein the patterned organic resist layer is removed by dry etching in a plasma atmosphere of oxygen gas.

10. The method as claimed in claim 8, wherein the patterned organic resist layer is removed between the steps (f) and (g).

11. The method as claimed in claim 8, wherein the patterned organic resist layer is removed between the steps (e) and (f).

12. The method as claimed in claim 1, wherein the subsidiary masking layer mainly composed of silicon dioxide is resistant to dry etching with a chlorine-based etching gas, but susceptible to dry etching with a fluorine-based etching gas.

* * * * *